United States Patent [19]

Green

[11] Patent Number: 5,214,587
[45] Date of Patent: May 25, 1993

[54] DEVICE FOR MONITORING UTILITY USAGE

[76] Inventor: Richard G. Green, 13513 NE. 126th Pl., Kirkland, Wash. 98034

[21] Appl. No.: 619,195

[22] Filed: Nov. 28, 1990

[51] Int. Cl.⁵ .......................... G06F 15/56; G01R 1/02
[52] U.S. Cl. ........................... 364/464.04; 340/870.02; 340/870.29
[58] Field of Search ........................... 364/464.04, 483; 324/113, 116, 74; 340/870.02, 870.29

[56] References Cited

U.S. PATENT DOCUMENTS

| | | | |
|---|---|---|---|
| 4,415,853 | 11/1983 | Fisher | 324/74 |
| 4,491,793 | 1/1985 | Germer et al. | 324/157 |
| 4,630,211 | 12/1986 | Pettis | 364/464.04 |
| 4,803,632 | 2/1989 | Frew et al. | 364/464.04 |
| 5,014,213 | 5/1991 | Edwards et al. | 364/483 |

Primary Examiner—Parshotam S. Lall
Assistant Examiner—Michael Zanelli
Attorney, Agent, or Firm—Trask, Britt & Rossa

[57] ABSTRACT

A device (10) for monitoring utility usage comprising a meter sensor assembly (16) attached to a utility meter (14) and a customer interface unit (20) placed inside a building (12). Sensor signals from the meter sensor assembly (16) are transmitted through a reset/driver unit (18) via the cable (22) to the customer interface unit (20) where the signal is processed into usable data that is communicated by a LCD display (114) on the front face (110) of the customer interface unit (20). Rotation of the meter disk (24) is sensed by infrared light signals (82) detecting the passage of the mark (38) on the edge (32) of the disk (24). The mounting assembly (40) is easily attached to the front face (30) of the transparent case (26). The reset/driver unit (18) includes a magnetic reset switch (98) that coordinates processing of data with the monthly billing cycle of the utility.

9 Claims, 3 Drawing Sheets

DEVICE FOR MONITORING UTILITY USAGE

TECHNICAL FIELD

The present invention relates to meters, and, more particularly, to a utility meter sensor and display device for use with existing public utility meters that enables utilities and consumers to monitor public utility usage.

BACKGROUND OF THE INVENTION

Because of the limited availability of resources, conservation of power, gas and water has become increasingly important and valuable to both consumers and public utility companies. Production costs for all utilities have escalated as it becomes increasingly expensive to build and operate utility plants. The increasing scarcity of these resources and increasing consumption makes it increasingly difficult for utility companies to supply all the utilities to all their customers at all times. Residential consumers see their utility expenditures growing as utility rates and usage escalate. Consumers and utility companies recognize the need to monitor and conserve electrical energy.

For example, the need has been recognized for residential consumers to utilize their electric power meters in monitoring their usage of electrical power. This need has been recognized because residential power users receive a monthly or bi-monthly bill documenting how much energy they have used. However, by the time the bill arrives, the opportunity to alter electrical power consumption has been missed. Consequently, there is a need for real-time information about electrical power consumption in order to make real-time usage adjustments.

Residential electrical energy usage is typically monitored by power companies through an electrical meter mounted external to the residential building. In most cases, these meters are connected to receive a three-line 240 VAC power feeder that includes a neutral wire and two 120 VAC power lines. The meter includes a transparent case having a horizontal disk mounted on a vertical shaft inside. The vertical shaft and disk rotate in response to the flow of electric current from the public utility lines through the meter to the residential house wiring. The horizontal disk includes one or more index marks near the periphery of the flat sides of the disk. The index mark is used by the public utility agency for calibrating the meter at the time of installation.

While several methods have been proposed for monitoring residential power consumption, these methods suffer from a number of disadvantages. For instance, U.S. Pat. No. 4,630,211, issued to Pettis on Dec. 16, 1986, teaches a watt-hour meter display for informing consumers of energy consumption. As taught by Pettis, an infrared sensor is mounted on the electric meter inside the transparent cover to monitor rotation of the horizontal disk. A portable display unit is provided on the interior of the house that communicates with the infrared sensor by means of the residential house wiring. The major drawback to this method is that the electric power meter must be partially dismantled and altered to enable installation of the infrared sensor. Power companies are unwilling to invest the time and man power in installing these devices and they are unwilling to permit consumers to dismantle the meter and install the devices themselves. Consequently, the consumer must pay a large fee to have the device installed in the meter. Another disadvantage of this and other methods is the inability of these prior art devices to coordinate the monitoring and display of electrical power consumption data with the billing cycle of the power company. In other words, the consumer has no idea of knowing when the meter has been read to enable them to compare power consumption data provided by the public utility company with the data generated by these prior art methods. Consequently, the usefulness of information provided by this and similar prior art methods is limited.

As is evident, there is a need for a power consumption monitoring device that can be easily installed by a consumer without requiring permission of the power company or tampering of the electric meter and/or the house and building wiring. Furthermore, there is also a need for such a device to be coordinated with the power company's billing cycle to enable accurate comparison and verification of usage. It will be recognized that this need extends to gas and water meters as well.

SUMMARY OF THE INVENTION

The present invention is directed to a monitoring and display device that is easily installed for use with existing public utility meters having a disk that is mounted inside a transparent case and which rotates in response to utility usage. The device comprises an optical sensing member externally mounted on the transparent case for optically sensing disk rotation speed and generating a signal in response thereto. One or more remote display terminals are electrically connected to the optical sensing member. Each display terminal includes a signal receiver and processor for receiving the signal from the optical sensing member and converting it into utility consumption data that is then stored in a memory. Each display terminal further includes a visual display for displaying the stored utility consumption data and a controller that enables selective displaying of the stored utility consumption data.

In accordance with another aspect of the present invention, the device further includes a manual reset switch mounted external to the transparent case and associated with the optical sensing member. The manual reset switch is electrically connected with the one or more remote terminals such that actuation of the manual reset switch allows a user to compare data stored prior to activation of the manual reset switch with data stored after actuation of the manual reset switch.

As will be readily appreciated from the foregoing description, the device for monitoring utility usage formed in accordance with the present invention does not require tampering with the utility meters nor will it require installation by the public utility repair personnel. Consequently, a residential consumer can quickly and easily install the optical sensing member without expending large sums of money. In addition, the manual reset switch is externally mounted on the transparent cover to allow the residential consumer or a public utility meter reader to easily and quickly reset the monitoring device at the time the power meter is read. This feature allows the consumer to compare their power consumption data with the public utility bill and assess the accuracy of the bill as well as assess and adjust their power consumption habits to achieve a more conservative level of electrical power usage.

BRIEF DESCRIPTION OF THE DRAWINGS

The foregoing and other features and advantages of the present invention will be more readily appreciated as the same becomes better understood from the detailed description when taken in conjunction with the following drawings wherein.

DETAILED DESCRIPTION OF THE PREFERRED EMBODIMENT

Figure 1:
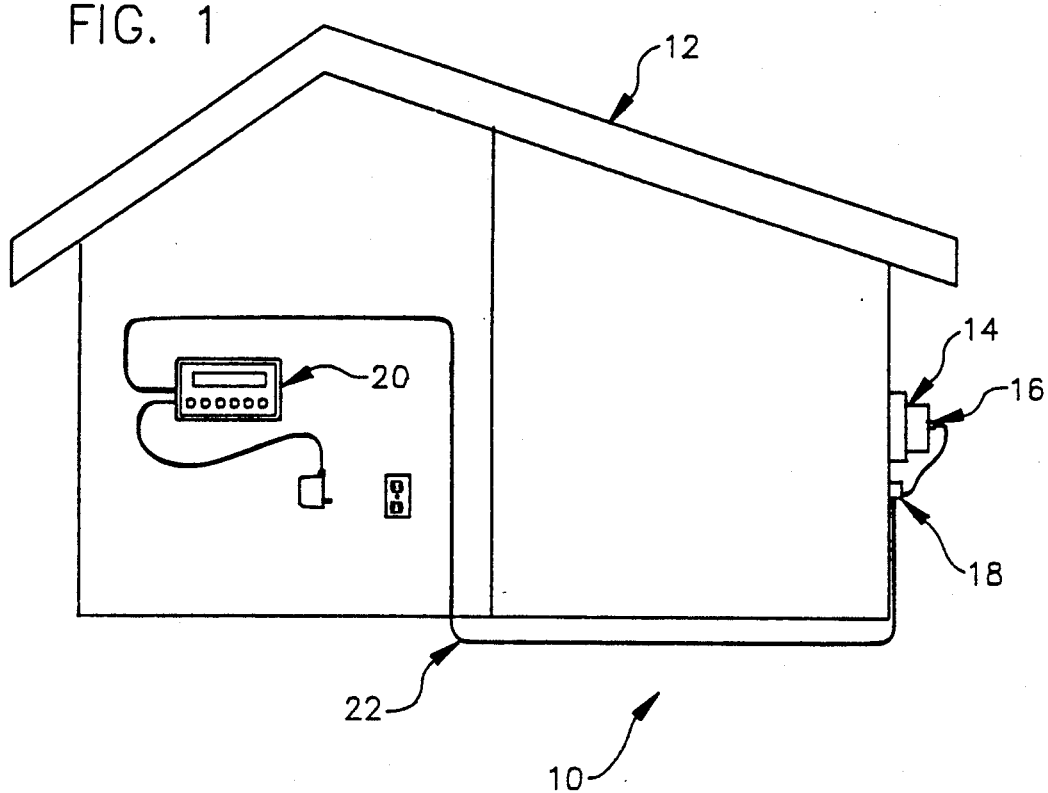
FIG. 1 is a schematic representation of the electrical power monitoring device formed in accordance with the present invention as installed in connection with a residential building.

Referring initially to FIG. 1, a device 10 for monitoring utility usage is illustrated in connection with a residential building 12. Mounted on the exterior of the building 12 is a utility meter 14. The device 10 includes a meter sensor assembly 16 attached to the outside of the meter 14, a reset/driver unit 18 associated with the meter sensor assembly 16 on the exterior of the building 12, a customer interface unit ("CIU") 20 located in the interior of the building 12, and a cable 22 to provide electrical communication between the meter sensor assembly 16, the reset/driver unit 18, and the customer interface unit 20.

While the cable 22 is shown in FIG. 1 as being placed under or on the exterior of the building 12, it can also be mounted on the interior of the building 12. It is to be further understood that while a residential building 12 is shown in FIG. 1, this is for illustrative purposes only. The present invention will have application in commercial as well as residential buildings. Finally, it is to be understood that while the present invention is described in connection with an electric power meter 14, shown in FIG. 1 as mounted in typical fashion for an electric power meter, the present invention will have application to any public utility meter that tracks usage of gas, power, or water.

The public utility meter 14 shown in FIG. 1 is an electric power meter of the conventional type and will not be described in detail herein. Briefly, the meter 14, illustrated in more detail in FIG. 3, includes a horizontally mounted disk 24 mounted to rotate about a vertical axis in a transparent case 26. The case 26, generally formed of glass or plastic, has a cylindrical sidewall 28 with a substantially flat front face 30. The disk 24, usually manufactured of aluminum, is substantially flat with an outer edge 32 that is orthogonal to the top and bottom surfaces 34 and 36 thereof. Normally, the disk 24 has a black mark 38 at a predetermined location on the edge 32 and at a corresponding position on the periphery of the adjacent top and bottom surfaces 34 and 36. This mark is typically used by the utility companies to calibrate the meter at the time of installation. In the case of the electric power meter 14 illustrated herein, the disk rotates at a speed corresponding to the amount of electric current usage in the building 12. That is, the more current being used in the building 12, the faster will be the rotation of the disk 24.

The present invention utilizes the periodic passing of the mark 38 past the front face 30 of the transparent case 26 to monitor electric current usage. More particularly, the meter sensor assembly 16 of the present invention is mounted on the front face 30 to sense the presence of the mark 38 on the edge 32 of the rotating disk 24. This is unlike prior art devices that are mounted inside the meter casing and sense the passing of a plurality of marks on the top surface of the disk. By sensing the presence of the mark 38 on the edge 32 of the rotating disk 24, the present invention lends itself to application on all meters having this type of mark, regardless of the presence of other markings on the top surface of the disk.

Figure 2:
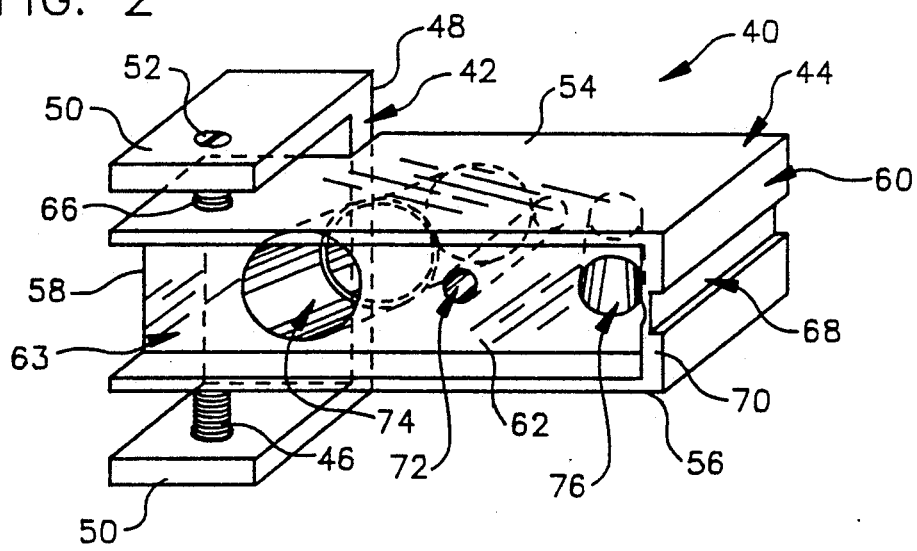
FIG. 2 is an isometric view of a mounting assembly for the data recording sensor formed in accordance with the present invention.

FIG. 2 illustrates in more detail the meter sensor assembly 16, which includes the mounting assembly 40 having a bracket 42 for mounting the assembly 40 to the transparent case 26 and a mounting body 44 pivotally mounted to the bracket 42 by a threaded fastener 46. To facilitate mounting of the assembly 40 to the transparent case 26, the bracket 42 includes a flat base 48 having a pair of legs 50 depending orthogonally therefrom in spaced parallel relationship. The fastener 46 is threadably engaged through both of the legs 50 to be in spaced parallel relationship with the base 48. Preferably, the fastener 46 is of the type having a slotted head 52 to enable turning of the fastener by a conventional flat-bladed screwdriver.

Figure 4:
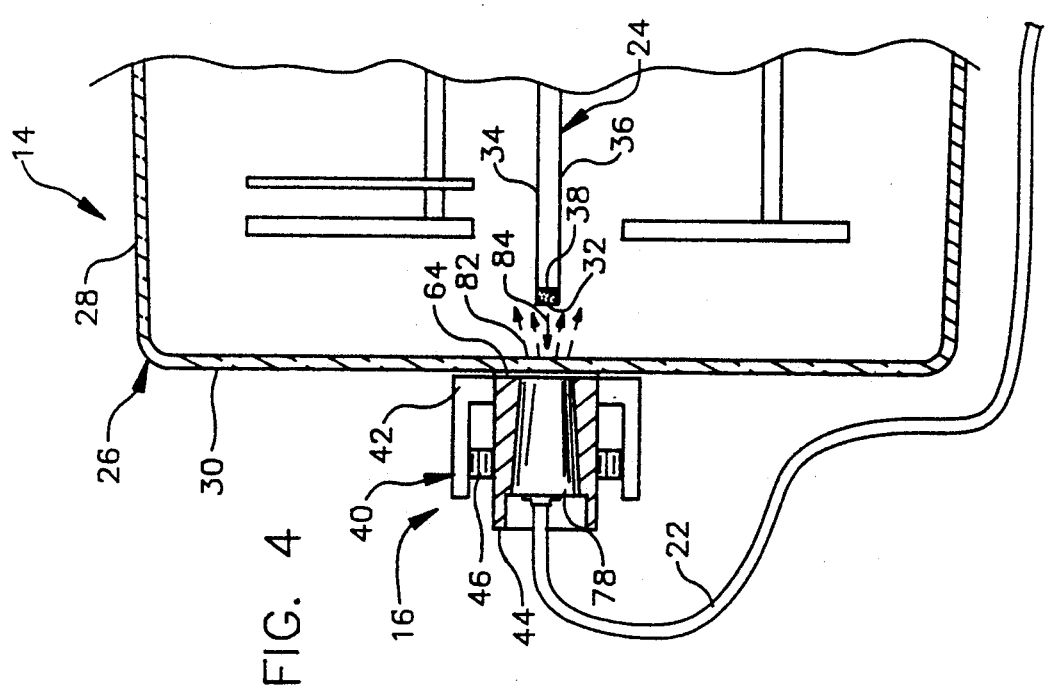
FIG. 4 is a cross sectional view of the data recording sensor assembly of FIG. 3 taken along lines 4—4.

The mounting body 44 has a substantial rectangular shape with smooth parallel top and bottom surfaces 54 and 56 and orthogonal first and second ends 58 and 60. The top and bottom surfaces 54 and 56 have their sides formed to extend beyond an outer side wall 62 of the body 44 such that a channel 63 is formed therein that opens to the first end 58. The inner side wall 64 (shown more clearly in FIG. 4) has a smooth, planar surface and is orthogonal to the first and second ends 58 and 60.

A threaded opening 66 is formed in the mounting body 44 near the first end 58 to receive the threaded fastener 46. The mounting body 44 is thus attached to the bracket 42 by threading the fastener 46 through the legs 50 on the bracket 42 and through the opening 66 in the mounting body 44. With the mounting body 44 so attached to the bracket 42, the mounting body 44 can pivot about the fastener 46 to facilitate installation and permit accurate positioning of the mounting body 44, as will be described in more detail below.

Figure 3:
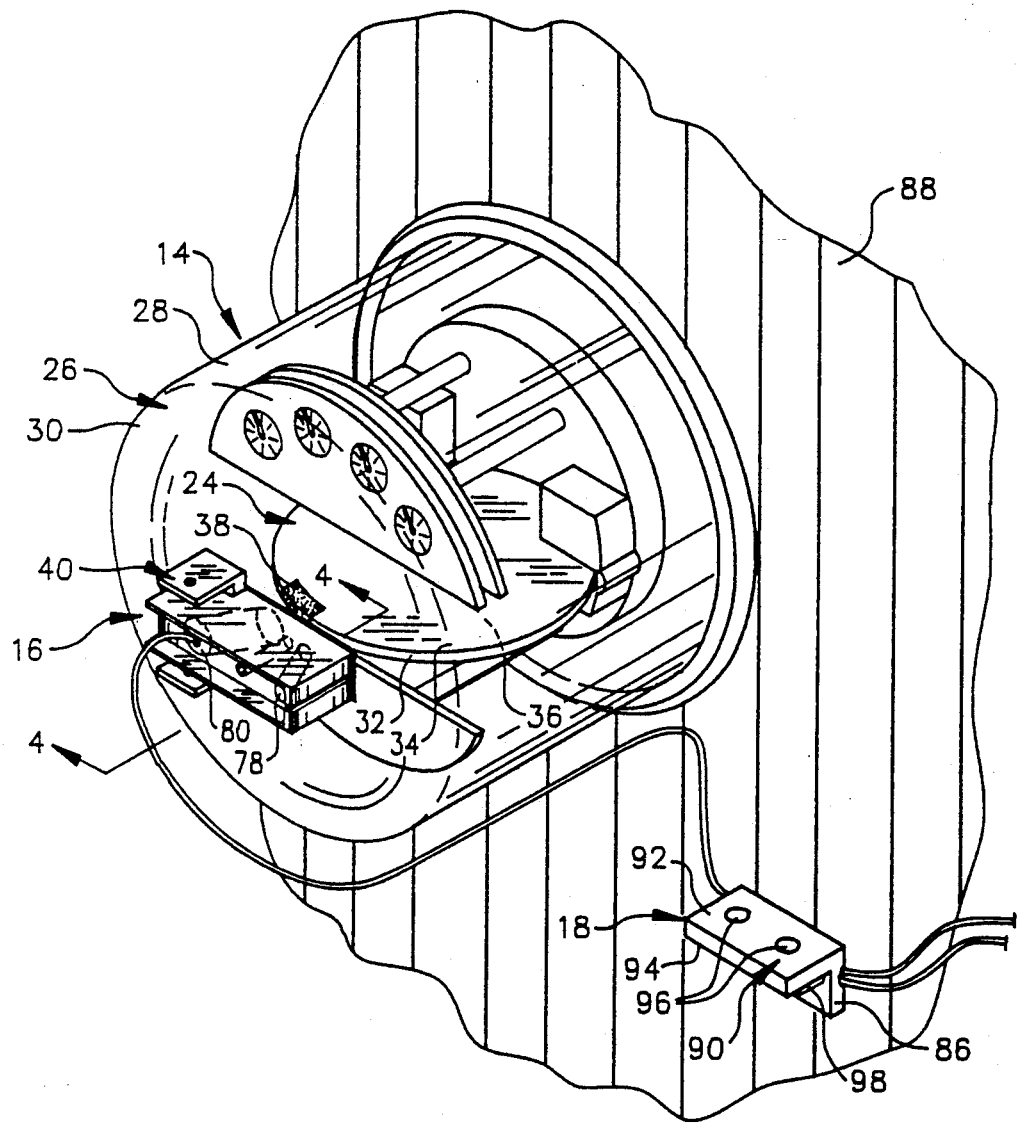
FIG. 3 is an isometric view of the data recording sensor assembly mounted to the front face of the meter in accordance with the present invention.

To aid in aligning the mounting assembly 40 with the meter disk 24, a groove 68 is formed laterally across the second end 60 of the mounting body 44 that communicates with the inner side wall 64 and the top edge 70 of the channel 63 formed in the outer side wall 62. In addition, a transverse opening 72 is centrally formed in the mounting body 44 that communicates with the outer side wall 62 and the inner side wall 64. The transverse opening 72 and the groove 68 are formed to lie in a plane that is substantially parallel to the plane of the top and bottom surfaces 54 and 56. A third opening 74 is shown formed in the mounting body 44 between the transverse opening 72 and the threaded opening 66. This third opening 74 is sized to receive an infrared sensor 78. As illustrated in FIG. 2, the third opening 74 is formed in the plane of the transverse opening 72 but at an angle to the transverse axis of the mounting body 44. Finally, a fourth opening 76 is also formed in the mounting body 44 between the transverse opening 72 and the second end 60 to lie in substantially the same plane as the transverse opening 72. However, the fourth opening 76 is also formed at an angle similar to the third opening 74 and is sized and shaped to receive an infrared transmitter 80, as shown in FIG. 3. More particularly, the third and fourth openings 74 and 76 are angled such that their longitudinal axes will intersect at a point a predetermined distance away from the inner side wall 64 of the mounting body 44. Ideally, this predetermined distance will be the horizontal distance between the edge 32 of the disk 24 and the inner side wall 64 of the mounting body 44 when the meter sensor assembly 16 is mounted on the transparent case 26.

With this construction, an infrared sensor 78 mounted in the third opening 74 and an infrared transmitter 80 mounted in the fourth opening 76 will communicate via light waves transmitted from the transmitter 80 towards the disk 24 and bounced off the edge 32 to be received into the sensor 78 in the fourth opening 76. This is illustrated more clearly in FIG. 4 in the cross-sectional view of the mounting assembly 40 and the meter 14. The transmitter 80 illustrated therein transmits infrared light signals, denoted by arrows 82, of which a portion are reflected back, denoted by arrow 84. The reflected back portion 84 is sensed by the sensor 78 (shown in FIG. 3). Preferably, the infrared light signal is modulated to prevent interference from direct sunlight.

The reset/driver unit 18 is shown more clearly in FIG. 3 as having generally an L-shaped cross sectional configuration with the back leg 86 affixed to the exterior wall 88 of the building 12 and a top leg 90 projecting outward therefrom. The top leg 90 has a top surface 92 and a bottom surface 94. Projecting from the top surface 92 are a pair of lights 96 preferably of the LED type. Projecting from the bottom surface 94 of the top leg 90 is a magnetic latch switch 98 that is actuated by passing a magnet or other magnetized object in close proximity thereto, as will be described in more detail below. It is to be understood that the unit 18 depicted in FIG. 3 is only a representative embodiment, and that it may be constructed to have other configurations suitable for its application. The reset/driver unit 18 includes a driver (not shown), preferably a 423 driver, to amplify and drive a signal from the sensor 78 to the customer interface unit 20.

Figure 5:
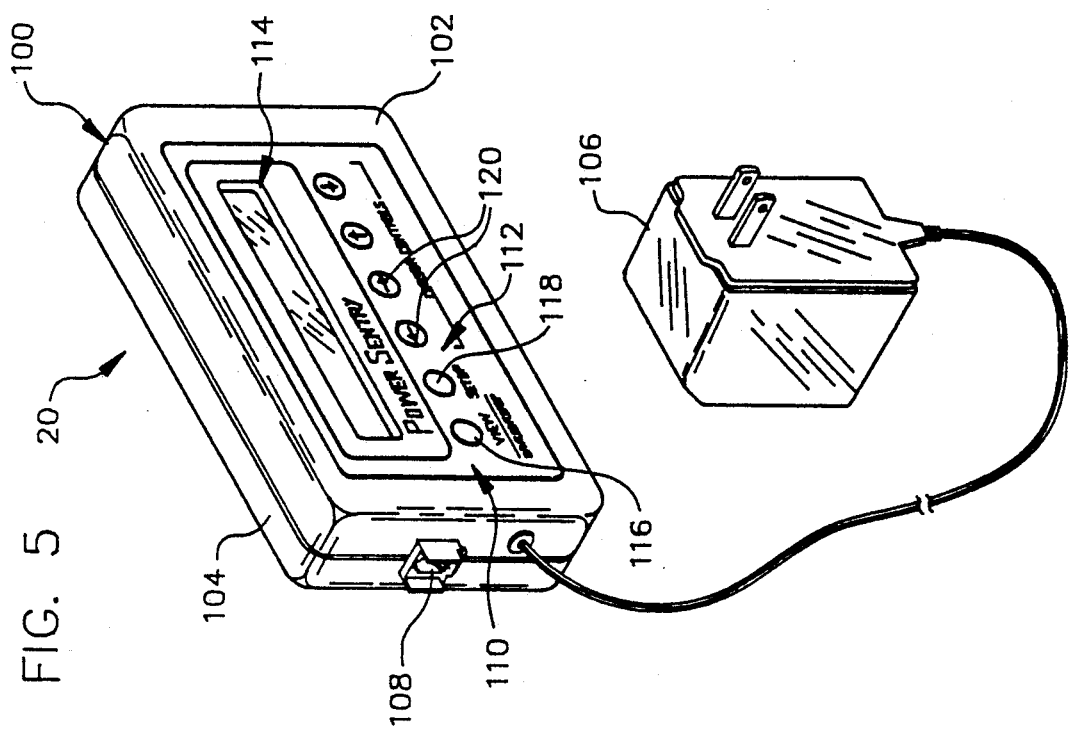
FIG. 5 is an isometric view of a customer interface unit formed in accordance with the present invention.

Turning now to FIG. 5, the customer interface unit 20 is illustrated in more detail to include a housing 100 formed of a front half 102 and back half 104, and a power supply 106 in the form of a conventional transformer to convert house voltage to the system operating voltage of 12 volts or, more preferably, 9 volts DC. Shown on the side of the housing 100 is a port 108 for connecting the cable 22. The front half 102 of the housing 100 has a face portion 110 that includes an LCD display 114 and six soft keys 112, with the keys 112 preferably having tactile feedback. The hardware and circuitry used in the CIU 20 for interpreting signals sent from the reset/driver unit 18 and displaying the processed information on the LCD display 114 pursuant to user instructions communicated through the keys 112 is of conventional nature and readily commercially available. Thus, it will not be described in detail herein. The CIU 20 may be mounted at any location within the building 12, such as on a wall or it may be placed on a table or other supporting surface.

Operation of the CIU is preferably controlled through the keys 112 in the following manner. Pressing of the button labeled "View" controls the display of various information on the LCD display 114. Pressing View 116 once displays the real time. Pressing View 116 a second time cycles the display to the current charge or billing rate for a watt of electricity. Pressing View 116 a third time displays the last month's kilowatt usage and total cost. Pressing View 116 a fourth time displays the daily budgeted amount in dollars of electrical usage and the actual daily usage in dollar amounts. Pressing View 116 again displays the average kilowatt per day usage in dollars. Pressing of View 116 again displays the actual dollar amount and actual kilowatt amount of power usage in the previous five minutes and displays a running clock showing how much time has elapsed since the last five-minute comparison. Cycling the display again shows the number of days into the current billing period. Finally, pressing View 116 again displays the default rate in dollar amount per watts. Other sequences and types of information may be used, however, without departing from the spirit and scope of the invention.

Pressing the "Set Up" key 118 enables a user to program in various information, including the time and date, the dollar per kilowatt rate, including two or more tiers for seasonal adjustments in the rate; the budgeted goal for the billing period; the peak demand alarm amount at which an alarm will be displayed if power usage exceeds a preprogrammed peak demand; and the meter type.

The four arrow keys 112 above the notation "Curser Controls" are used to enter information into the CIU.

Installation of the components of the monitoring device 10 is simple and straight forward. The meter sensor assembly 16 is delivered to the customer with the transmitter 80 and sensor 78 already mounted in the mounting body 44 and sealed with a water-proof sealant. The mounting body 44 in turn is mounted to the bracket 42 by the fastener 46. A clear or translucent sheet of adhesive is affixed to the inner wall 64 of the mounting body 44, and a sheet of adhesive (not shown) is also affixed to the base 48 of the bracket 42.

To attach the mounting assembly 40 to the transparent case 26, the sheet of adhesive on the bracket 42 is exposed by removing a protective cover. The mounting assembly 40 is then held in close proximity to the front face 30 of the transparent case 26 and oriented in the position shown in FIG. 3. The transmitter 80 and sensor 78 are aligned with the edge 32 of the disk 24 by the user simultaneously sighting through the transverse opening 72 and the grooves 68 in the mounting body 44 and aligning the mounting body 44 with the disk 24. When the mounting assembly 40 is roughly aligned, the bracket 42 is pressed against the transparent case 26 so that the base 48 is adhered to the front face 30 of the transparent case 26 by the sheet of adhesive (not shown).

Fine adjustment in vertical alignment with the transmitter 80, sensor 78, and the plane of the disk 24 is accomplished by rotating the fastener 46. Turning the fastener 46 in a clockwise position when viewed from the top causes the mounting body 44 to move upward, and vice versa. The monitoring device 10 must be completely installed and operational, to enable fine adjustment in the alignment of the mounting body 44 with the disk 24. Fine adjustment with the disk 24 is accomplished by rotating the fastener 46 and observing the LCD lights 96 on the reset/driver unit 18. The mounting body 44 is moved up and down with the fastener 46 until a red light 96 on the reset/driver unit 18 extinguishes. In accordance with the preferred embodiment of the invention, the red light 96 will illuminate when the mark 38 interrupts the transmission and sensing of the infrared light signal 82. Hence, a consumer with little or no mechanical ability can easily install and align the mounting assembly 40 without requiring the assistance of a skilled craftsman. Once the mounting body 44 is aligned with the disk 24, the transparent adhesive is exposed and the mounting body 44 is pressed against the front face 30 of the transparent case 26. This effectively seals out rain, snow, or other liquids and contaminants that could interfere with communication of the infrared light signal 82.

The reset/driver unit 18 is shown installed on the exterior wall 88 of the building 12. However, other installation locations can be used, so long as the reset/driver unit 18 is in close proximity to the meter 14 or available to the user and/or utility personnel. When the meter 14 is read by the utility company, the meter reader can reset the monitoring device 10 by passing a magnetized object beneath the reset switch 98. When the reset switch 98 is activated, a greed LCD light 96 will briefly illuminate to indicate that resetting has been accomplished.

By resetting the device 10, data stored prior to resetting is segregated from data stored after resetting to enable the customer to compare electrical usage prior to resetting with electrical usage after resetting. Resetting may also be done by the customer if needed.

The cable 22 is preferably RJ11 cable that can be installed under the ground or under the house, or along the side of the house and brought to the interior of the house using conventional installation methods. The cable is plugged into the port 108 and the transformer 106 is plugged into an outlet 124 in the building 12. After installation, the CIU is configured for the particular application using the Set Up 118 key and the View 116 key and the various arrow keys 120. Inasmuch as the present invention is useful on all types of utility meters, the installation and set up procedures will be adapted to the particular application and need not be described in detail here other than as already described above.

While a preferred embodiment has been illustrated and described, it is to be understood that various changes may be made therein without departing from the spirit and scope of the invention. For instance, an RS232 port can be provided on the CIU 20 to enable communication with a personal or business computer. In addition, data from the meter sensing assembly can be transmitted to the CIU 20 by means of radio frequency transmission instead of using the cable 22. Consequently, the invention may be practiced otherwise than as described herein and the scope of the invention is to be limited only by the appended claims.

The embodiments of the invention in which an exclusive property or privilege is claimed are defined as follows:

1. A device for monitoring utility usage for installation and use by homeowners and consumers with existing public utility meters having a disk that is mounted inside a transparent case and that rotates in response to electrical current usage, the device comprising:
   a disk rotation monitoring assembly for mounting on the exterior of the transparent case, said monitoring assembly comprising:
   (a) a sensor for sensing disk rotation speed and generating a signal in response thereto; and
   (b) means for mounting said sensor on the transparent case, said mounting means further comprising means for holding said sensor, means for attaching said holding means to the transparent case, and means for adjusting the position of said holding means to enable precise alignment of said sensor with the plane of the disk such that said sensor is in optical communication with the edge of said disk;
   one or more remote display terminals in electrical communication with said monitoring assembly, each of said one or more remote terminals comprising:
   (a) means for receiving said signal and processing said signal into utility consumption data;
   (b) an electronic memory for storing said data;
   (c) a visual display for displaying data in a reader-usable format about consumption; and
   (d) a display controller that enables selective displaying of any of said data on said visual display.

2. The device of claim 1, further comprising a manual reset switch associated with said optical sensing assembly and mounted external to the transparent cover, said manual reset switch being electrically coupled to said signal receiving and processing means such that upon actuation of said manual reset switch data processed prior to actuation of said manual reset switch is segregated from data processed after actuation of said manual reset switch.

3. The device of claim 2, wherein said holding means comprises a sealable enclosure to prevent the entry of water and dirt, and further includes an opening through which said sensor can optically monitor disk rotation.

4. The device of claim 3, wherein said attaching means comprises a transparent filament having adhering material on both sides for attaching said sealable enclosure to the transparent case with said opening facing the disk such that disk rotation can be monitored by said sensor through said transparent filament while liquid and contaminants are prevented from entering therein.

5. The device of claim 4, wherein said manual reset switch comprises a magnetically-sensitive switch such that presentation of a magnetic field of a predetermined strength in close proximity to said magnetically-sensitive switch causes actuation of said switch.

6. An electrical power usage monitoring and display device for installation and use by homeowners and consumers with existing public utility power meters that have a disk, which is mounted inside a transparent cover, rotating in response to electric current usage, the device comprising:
   an optical sensor for optically sensing disk rotation speed and generating a signal in response thereto;
   a mounting assembly for adhesively mounting said optical sensor directly on the exterior of the transparent case such that the optical sensor lies in the plane of the disk in optical communication with the edge of the disk;
   a processor means for receiving said signal and processing said signal into electrical power consumption data;
   a visual display device for displaying data in a reader-usable format about consumption usage and cost; and
   a key pad associated with said processor means and said visual display that enables a user to enter information into said processor means and enables selective displaying of said electrical power consumption data.

7. The device of claim 6, further comprising a magnetically-actuated switch electrically coupled to said processor means such that actuation of said switch causes segregation of data processed after actuation of said switch from data processed prior to actuation of said switch.

8. The device of claim 7, wherein said mounting assembly is attached to the external surface of the transparent case by means of a transparent filament having adhesive material on both sides to enable optical communication between said optical sensor in said mounting assembly and the edge of the rotating disk and to further enable sealing of said mounting assembly to prevent liquid and contaminants from entering therein.

9. The device of claim 8, wherein said mounting assembly includes an arm pivotally mounted on a bracket such that said bracket can be separately attached to the transparent case from the attachment of the arm, and further comprising means for adjusting the position of said arm relative to the position of said bracket such that after attachment of said bracket to the transparent case, said arm can be adjusted into alignment with the plane of the rotating disk prior to attachment of said arm to the transparent case.

* * * * *